United States Patent [19]

Killcommons

[11] Patent Number: 4,907,976

[45] Date of Patent: Mar. 13, 1990

[54] CONNECTOR

[75] Inventor: Peter Killcommons, New York, N.Y.

[73] Assignee: Killy Corporation, New York, N.Y.

[21] Appl. No.: 162,441

[22] Filed: Mar. 1, 1988

[51] Int. Cl.$^4$ .............................................. H01R 9/09
[52] U.S. Cl. ..................................... 439/72; 439/81; 439/525
[58] Field of Search ...................... 439/71, 72, 80, 81, 439/525, 526

[56] References Cited

U.S. PATENT DOCUMENTS 4,188,085  2/1980  Aldridge et al. .................... 439/525
4,679,871  7/1987  Egaua ................................. 439/72

Primary Examiner—P. Austin Bradley
Attorney, Agent, or Firm—Pennie & Edmonds

[57] ABSTRACT

A connector provides electrical connection between a component and another device such as a circuit board or an input/output connector. The connector has a non-conductive base and adjacent sides extending in a direction away from the base, forming a cavity. The shape and size of the cavity formed physically mates with the component when the connector is placed over the component. Conductive contacts provide the electrical connection between the component pins and the other device. The lower portion of each contact is located inside the cavity and positioned such that it aligns with and touches one of the component pins when the device is placed over the component. The upper portion of each contact is located on the outside surface of base and has a size and shape to physically and electrically mate with individual contacts of the other device.

20 Claims, 4 Drawing Sheets

CONNECTOR

BACKGROUND OF THE INVENTION

This relates to a connector for electronic components, such as integrated circuits and, in particular, to a device for providing additional connections to such components while they are mounted on circuit boards, cards or the like.

Such electronic components typically comprise a body containing the circuitry of the component and a plurality of legs or pins which extend out of the body (see FIG. 1). The pins provide the means for supplying power to the component, input signals to the component and output signals from the component. The components are inserted or mounted on a circuit board which provides the electrical interconnection to still other components on the same or different circuit boards or even in other devices. Connections between circuit boards are often made by providing along one edge of each circuit board flat-conductive contacts called "fingers". The fingers act as male connectors for insertion into slots and the interconnection between the circuit boards is provided by interconnecting the slots in which the individual circuit boards are mounted. Another way for providing electrical input/output connections is to physically provide input/output contacts along an edge of the circuit board and permanently attach a connector to the circuit board so that the connector makes electrical contact with the input/output contacts on the circuit board. For example, one-half of a ribbon cable connector can be permanently mounted, such as by soldering, in conductive through-holes along the edge of the circuit board. The other half of the ribbon cable connector which is attached to the ribbon cable can then be mated with the half of the connector permanently mounted on the board so as to provide a connection to another circuit board or device.

Sometimes after the components have been assembled on a circuit board, the functionality of the circuit is corrected, modified, added to or reduced by adding and/or removing components, connections to components, other circuit boards and/or connections to other circuit boards. For example, the functionality of the device using the circuit board may be changed as when a personal computer is upgraded or additional peripherals are added. In such circumstances, there is a need for a means to easily modify connections to components which have been mounted on a circuit board. As will be appreciated, it is often found that once the circuit board has been placed inside the device in which it is to operate it is not practical to access the input/output connectors to make such modifications. In addition, it often is desirable to be able to mount additional circuit boards in the device even though all the circuit board mounting slots are occupied.

SUMMARY OF THE INVENTION

It is therefore an object of the present invention to provide a simple means for electrically accessing components mounted on a circuit board.

It is another object of the invention to provide a simple means of mounting additional circuit boards in a device.

In accordance with the invention, a connector is designed to fit over the component to which connection is to be made and make electrical contact with the input/output pins of the component. In a preferred embodiment of the invention, the connector is a rectangular solid having a base and four sides extending away from one surface of the base and defining a cavity therebetween. The size and shape of the formed cavity is such that the connector can be fitted snuggly over the component and attached thereto. At least one electrically conductive contact, and preferably as many contacts as there are input and output pins of the component is contained within the connector, the contact having an upper and lower portion. The lower portion of each contact is situated on an inside surface of the cavity at a location such that the contact aligns with and physically contacts an input/output pin of the component when the connector is placed over the component. The upper portion of each contact extends through the base to form a raised pin on the opposite surface. Another circuit board can then be mounted on the pins. Alternatively, a connector, such as a ribbon cable, can be mated with the pins for connection to another component or device.

DESCRIPTION OF THE DRAWINGS

These and other objects, features and advantages of the invention will be more readily apparent from the following detailed description of a preferred embodiment of the present invention in which.

DETAILED DESCRIPTION OF THE PREFERRED EMBODIMENTS

Figure 1:
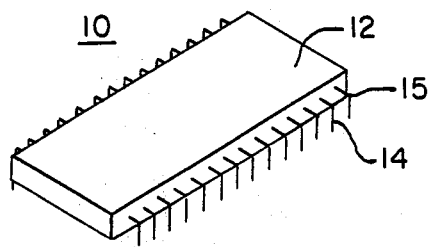
FIG. 1 is an example of an integrated circuit component.
Figure 2:
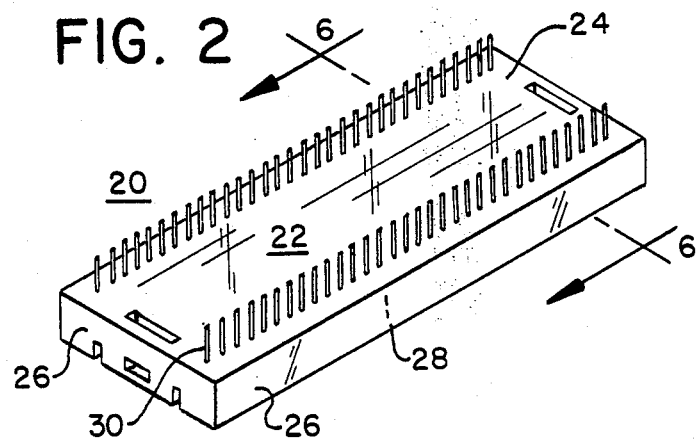
FIG. 2 is a perspective view of a preferred embodiment of the connector of the present invention.
Figure 3:
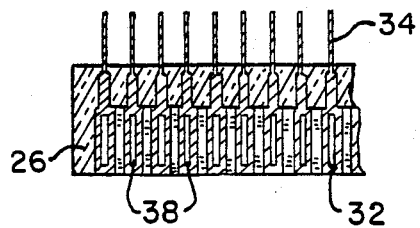
FIG. 3 is a cutaway side view of a preferred embodiment of the present invention.

Referring to FIG. 1, an integrated circuit component 10 is exemplary of a component that may be used with the apparatus of the present invention. The component illustrated contains a body 12 having a plurality of legs or pins 14 extending out the sides of the body and making a 90 degree turn 15 so that the ends of the pins all point downward. As shown in FIG. 1, the ends of the pins form two parallel lines that are inserted into two corresponding lines of holes in a circuit board (not shown) to mount the component on the board and connect it to circuitry thereon.

The connector of the present invention is constructed to fit over the component and provide a simple accessible means for connecting to other components, circuit boards or devices. Referring to FIGS. 2 through 5, a connector 20 comprises a non-conductive base 22 having a primary or outside surface 24. Adjacent non-conductive side portions 26 extend in a direction away from the primary surface 24 of the base 22 forming a cavity 28. The cavity 28 is of a size and shape to physically cover and mate with the component. In other words, as illustrated in FIG. 5, the connector should fit snuggly over the component. In the illustrated embodiment, the cavity formed is rectangular in shape. However, the cavity formed may be of any shape that is compatible with the shape of the component.

Connector 20 contains at least one conductive contact 30 to provide an electrical connection to a pin 14 of the component. Preferably there is one contact 30 for each pin of the component as shown in FIG. 5.

Figure 7:
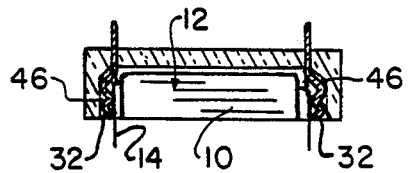
FIG. 7 is a cross-sectional view along line 7—7 of FIG. 5.

Referring to the sectional views of connector 20 in FIG. 3, 4, 6 and 7, each conductive contact comprises a lower portion 32 and an upper portion 34. Lower portion 32 is located on the inside of the cavity 28 and is biased towards the center of the cavity. Each lower portion 32 is positioned such that it aligns with and touches one of component pins 14 when connector 20 is placed over component 10 as shown in FIG. 7. Preferably the lower portions of the contacts are constructed of long, narrow conductive members with one or more curves or bends in the direction of the interior of the cavity. It is preferred that a slotted opening 38 is provided in each member. The slotted opening 38 gives the member greater flexibility and thus permits better electrical and physical contact with the pins of the component.

Figure 4:
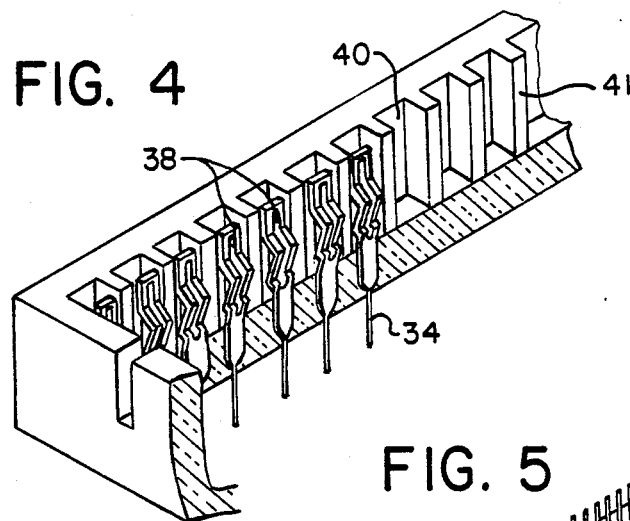
FIG. 4 is an inside cutaway view of a preferred embodiment of the present invention.
Figure 5:
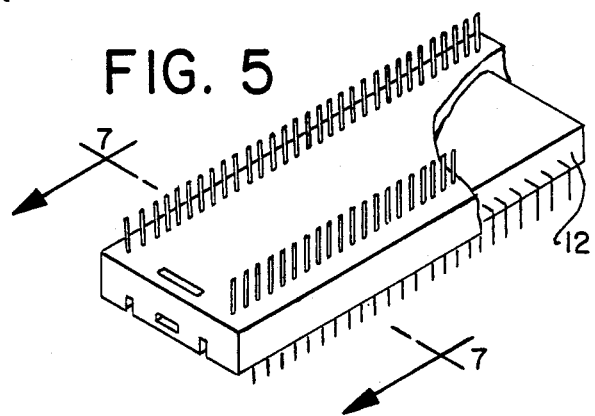
FIG. 5 is a perspective view of the connector mounted on the component.
Figure 6:
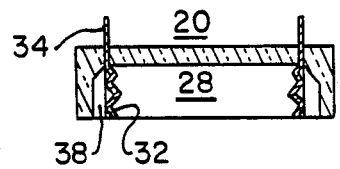
FIG. 6 is a cross-sectional view along line 6—6 of FIG. 2.

Advantageously, each contact is mounted in connector 20 so that its lower portion is aligned with a recess or channel 40 defined by adjacent ridges 41 in a side portion of the connector as illustrated in FIG. 4. The ridges are formed as part of the side portion 26 and extend far enough into cavity 28 as to separate the lower portions 32 of the contacts when they are mounted on pins 14. As a result the ridges serve to insulate the lower portions from one another. Preferably the recesses are rectangular in shape having a width slightly larger than the width of the lower portion of the contact. Advantageously, as shown at 46 in FIG. 7, the recesses also are deep enough to permit the lower portion of the contacts to move backward as they are fitted over pins 14 of a component so as to accommodate variations in pin placement. In addition, the recesses, by providing more space for the contacts to move backward, as shown in FIG. 7, reduce the stress on the connector thereby increasing the durability of the connector.

Figure 8:
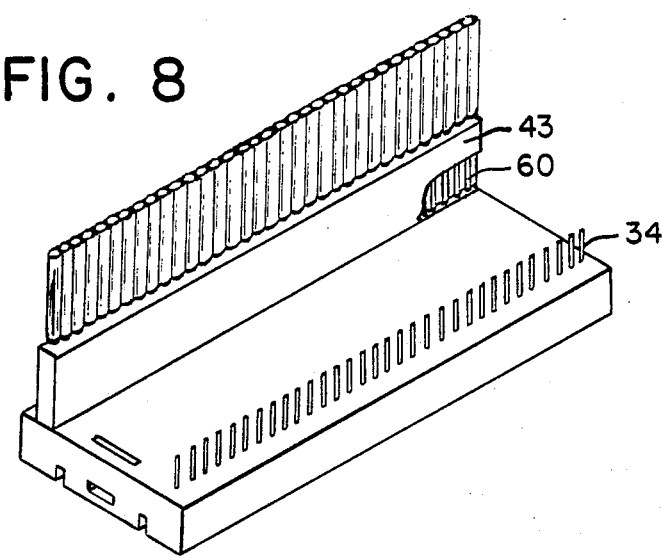
FIG. 8 illustrates a ribbon cable connector mounted on the connector of the present invention.
Figure 10:
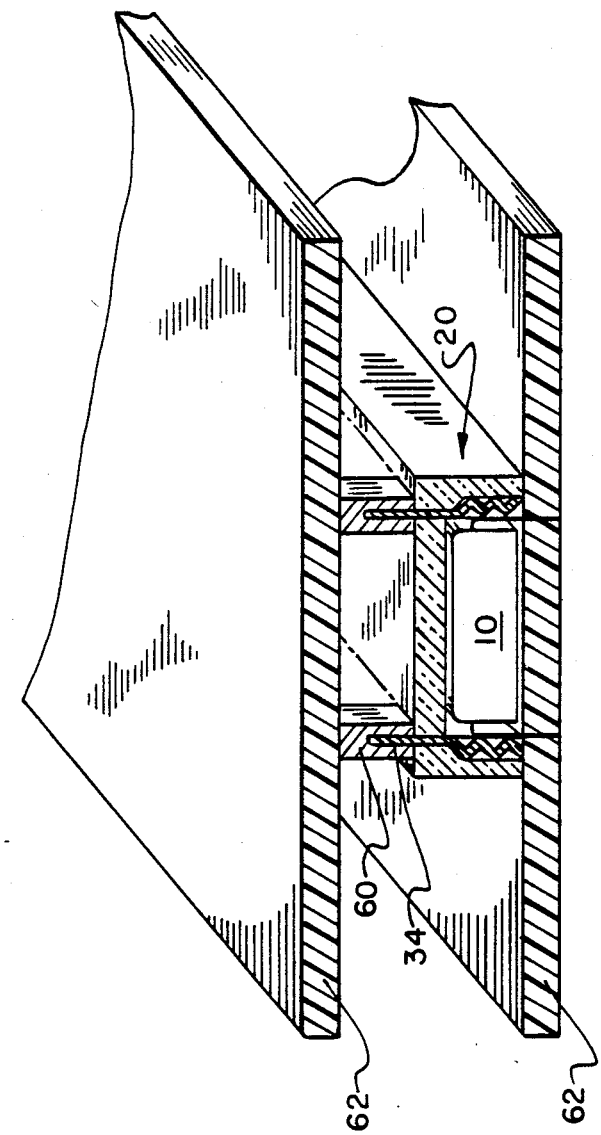
FIG. 10 illustrates the mounting of a circuit board on the connector of the present invention.

Contact 30 extends up through the base 12 and forms an upper portion 34 which is of a size and shape to physically and electrically mate with another device. Preferably, each upper portion of the contact is a pin 34 that mates with the contacts of a female connector 60 that is securely mounted to the underside of another circuit board 62 as illustrated in FIG. 10. As a result, the second circuit board may be mounted in the device even though all the circuit board mounting slots of the device are already occupied. Alternatively, the upper portion may be of a size and shape to mate with a female ribbon cable connector 43 as illustrated in FIG. 8 or with any type of male connector.

Figure 9:
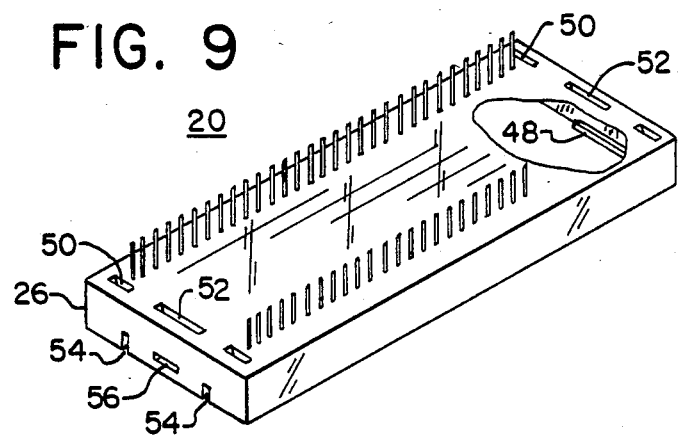
FIG. 9 is a preferred embodiment of the present invention illustrating the use of flanges and slotted openings to lock the connector over the component and the ribbon cable connector onto the connector.

Referring to FIG. 9, connector 20 of the present invention may also have a means for clamping or locking the connector to the component and a means for clamping the input/output connector to the connector. The connector 20 may be provided with at least one flange 48 located on an inside surface of the cavity. Preferably a flange is located at two opposite ends of the connector 20. The flange functions to hook under the body of component 10 locking the connector onto the component. Flanges may also be provided on an outside surface of the connector to provide a means for the input/output connector to lock onto the connector. Preferably however, the connector is provided with slots or holes 50 that are compatible with the locking means provided on the input/output connector.

In addition, slots or holes 52, 54, 56 are preferably included on the outside surface 24 and side portions 26 to provide a means for placing the connector on the component and removing the connector from placement over the component. For example, a screwdriver may be inserted into slots 54 to act as a lever to push the connector on or off the component.

While the invention has been described in conjunction with specific embodiments, it is evident that numerous alternatives, modifications, variations and uses will be apparent to those skilled in the art in light of the foregoing description.

I claim:

1. An apparatus for providing electrical connections to an integrated circuit having conductive input/output pins extending in a first direction away from the integrated circuit comprising:
a non-conductive base having a primary surface and adjacent sides around the perimeter of the primary surface extending in a direction away from the primary surface thereby forming a cavity, said cavity of a size and shape to physically mate with the integrated circuit when the base is placed over the integrated circuit such that the sides extend in the same direction as the input/output pins;
at least one conductive contact to provide electrical connection to the input/output pins, comprising:
a lower portion located inside the cavity having a bias toward the center of the cavity and positioned such that it aligns with and touches one of said input/output pins when the apparatus is placed over the integrated circuit; and
an upper portion located on the primary surface of the base and electrically connected to the lower portion, said upper portion having a size and shape to electrically and physically mate with a contact of another device;
whereby electrical connection is provided between the integrated circuit and said other device; and
a first clamping means to lock the apparatus over the integrated circuit, said clamping means comprising at least one flange located on the inside of the cavity, said flange engaging with an edge of the integrated circuit to lock the apparatus over the integrated circuit.

2. The apparatus of claim 1 further comprising a second clamping means to lock an input/output connector onto the apparatus.

3. A device for providing electrical connections between a first circuit board and an integrated circuit having conductive input/output pins extending in a first direction away from the integrated circuit and being mounted on a second circuit board, said device comprising:
a non-conductive base having a top portion and side portions which extend perpendicular to the top portion thereby forming a cavity, said cavity of such size and shape to physically mate with the integrated circuit when the base is placed over the integrated circuit such that the side portions extend in the same direction as the input/output pins;

a plurality of conductive contacts each comprising:
- a lower contact portion located inside the cavity having a bias towards the center of the cavity and positioned such that it aligns with and touches one of the input/output pins when the base is placed over the integrated circuit; and
- an upper contact portion located on the top surface of the base having a size and shape and positioned such that it electrically and physically mates with the first circuit board;

whereby electrical connections are provided between the individual pins of the integrated circuit and the first circuit board and the first circuit board is mounted on the second circuit board.

4. The device of claim 3 further comprising a plurality of channels having a width slightly wider than the width of the lower conductive contact portion located along the inside of the cavity and aligned with the lower conductive contact portion such that when the device is placed over the a part of the lower conductive contact portion is forced away into the channel.

5. The device of claim 3 further comprising a second clamping means to lock a ribbon cable connector to the device.

6. The device of claim 3 wherein the lower portion of the conductive contact further comprises a slotted opening in the center of the contact.

7. The device of claim 3 further comprising a first clamping means to lock the device over the integrated circuit.

8. The device of claim 7 wherein the first clamping means comprises at least one flange extending out of an inside surface of the cavity, said flange engaging an edge of the integrated circuit to lock the device over the integrated circuit.

9. An apparatus for providing electrical connections to an electrical component having conductive input/output pins comprising:
a non-conductive base having a primary surface and adjacent sides around the perimeter of the primary surface extending in a direction away from the primary surface thereby forming a cavity, said cavity of a size and shape to physically mate with the electrical component when the base is placed over the component;
at least one conductive contact to provide electrical connection to the component input/output pins, comprising:
- a lower portion located inside the cavity having a bias toward the center of the cavity and positioned such that it aligns with and touches one of said input/output pins when the device is placed over the component; and
- an upper portion located on the primary surface of the base and electrically connected to the lower portion, said upper portion having a size and shape to electrically and physically mate with a contact of another device;

whereby electrical connection is provided between the electrical component and said other device; and
a first clamping means comprising at least one flange located on the inside of the cavity, said flange engaging an edge of the component to lock the apparatus over the component.

10. An apparatus for providing electrical connections to an electrical component having conductive input/output pins comprising:
a non-conductive base having a primary surface and adjacent sides around the perimeter of the primary surface extending in a direction away from the primary surface thereby forming a cavity, said cavity of a size and shape to physically mate with the electrical component when the base is placed over the component;
at least one conductive contact to provide electrical connection to the component input/output pins, comprising:
- a lower portion located inside the cavity having a bias toward the center of the cavity and positioned such that it aligns with and touches one of said input/output pins when the device is placed over the component; and
- an upper portion located on the primary surface of the base and electrically connected to the lower portion, said upper portion having a size and shape to electrically and physically mate with a contact of another device;

whereby electrical connection is provided between the electrical component and said other device;
a first clamping means to lock the apparatus over the component; and
a second clamping means to lock an input/output connector onto the apparatus.

11. A device for providing electrical connections between an electrical component having conductive input/output pins and a circuit board comprising:
a non-conductive base having a top portion and side portions which extend perpendicular to the top portion thereby forming a cavity, said cavity of such size and shape to physically mate with the electrical component when the base is placed over the electrical component;
a plurality of conductive contacts each comprising:
- a lower contact portion located inside the cavity having a bias towards the center of the cavity and positioned such that it aligns with and touches one of the electrical component pins when the base is placed over the electrical component; and
- an upper contact portion located on the top surface of the base having a size and shape and positioned such that it electrically and physically mates with the circuit board;

whereby electrical connections are provided between the individual pins of the electrical component and the circuit board; and
a first clamping means comprising at least one flange extending out of an inside surface of the cavity, said flange engaging an edge of the electrical component to lock the device over the electrical component.

12. A device for providing electrical connections between an electrical component having conductive input/output pins and a circuit board comprising:
a non-conductive base having a top portion and side portions which extend perpendicular to the top portion thereby forming a cavity, said cavity of such size and shape to physically mate with the electrical component when the base is placed over the electrical component;
a plurality of conductive contacts each comprising:

a lower contact portion located inside the cavity having a bias towards the center of the cavity and positioned such that it aligns with and touches one of the electrical component pins when the base is placed over the electrical component; and an upper contact portion located on the top surface of the base having a size and shape and positioned such that it electrically and physically mates with the circuit board;

whereby electrical connections are provided between the individual pins of the electrical component and the circuit board;

a first clamping means to lock the device over the electrical component; and a second clamping means to lock a ribbon cable connector to the device.

13. An apparatus for mounting a first circuit board on an integrated circuit having conductive input/output pins which extend in a first direction toward and are mounted on a second circuit board, said apparatus comprising:

a non-conductive base having a primary surface and adjacent sides around the perimeter of the primary surface extending in a direction away from the primary surface thereby forming a cavity, said cavity of a size and shape to physically mate with the integrated circuit when the base is placed over the integrated circuit so that the direction in which the sides extend is the same as said first direction; and a plurality of conductive contacts each comprising:

a lower contact portion located inside the cavity having a bias towards the center of the cavity and positioned such that it aligns with and touches one of the integrated circuit pins when the base is placed over the integrated circuit; and an upper contact portion located on the top surface of the base having a size and shape and positioned such that it electrically and physically mates with the first circuit board;

whereby electrical connections are provided between the individual pins of the integrated circuit and the first circuit board and the first circuit board is mounted on the second circuit board.

14. A method for mounting a first circuit board on a second circuit board comprising the steps of:

placing on an integrated circuit having conductive input/output pins which extend in a first direction toward and are mounted on a second circuit board a connector comprising:

a non-conductive base having a primary surface and adjacent sides around the perimeter of the primary surface extending in a direction away from the primary surface thereby forming a cavity, said cavity being of a size and shape to physically mate with the integrated circuit when the base is placed over the integrated circuit so that the direction in which the sides extend is the same as said first direction; and a plurality of conductive contacts each comprising:

a lower contact portion located inside the cavity having a bias towards the center of the cavity and positioned such that it aligns with and touches one of the integrated circuit pins when the base is placed over the integrated circuit; and an upper contact portion located on the top surface of the base; and mounting on the upper contact portions of said conductive contacts said first circuit board, said upper contact portions having a size and shape and being positioned so that they electrically and physically mate with the first circuit board;

whereby electrical connections are provided between the individual pins of the integrated circuit and the first circuit board and the first circuit board is mounted on the second circuit board.

15. An apparatus for providing electrical connections to an integrated circuit having conductive input/output pins extending in a first direction away from the integrated circuit and mounted on a first circuit board comprising:

a non-conductive base having a primary surface and adjacent sides around the perimeter of the primary surface extending in a direction away from the primary surface thereby forming a cavity, said cavity of a size and shape to physically mate with the integrated circuit when the base is placed over the integrated circuit such that the sides extend in the same direction as the input/output pins; and at least one conductive contact to provide electrical connection to the input/output pins, comprising:

a lower portion located inside the cavity having a bias toward the center of the cavity and positioned such that it aligns with and touches one of said input/output pins when the device is placed over the integrated circuit; and an upper portion located on the primary surface of the base and electrically connected to the lower portion, said upper portion having a size and shape to electrically and physically mate with a contact of another device;

whereby electrical connection is provided between the integrated circuit and said other device.

16. The apparatus of claim 15 wherein the upper portion of the conductive contact comprises a male connector pin.

17. The apparatus of claim 15 wherein the lower portion of the conductive contact further comprises a slotted opening in the center of the contact.

18. The apparatus of claim 6 further comprising a plurality of channels having a width slightly wider than the width of the lower conductive contact portions located along the inside of the cavity and aligned with the lower portion of the conductive contact such that when the apparatus is placed over the integrated circuit a part of the lower conductive contact portion is forced into the channel.

19. The apparatus of claim 15 wherein the other device is a second circuit board.

20. The apparatus of claim 15 wherein the other device is a circuit board and the apparatus comprises means for mounting said circuit board on said base.

* * * * *